US010896138B2

(12) United States Patent
Su et al.

(10) Patent No.: US 10,896,138 B2
(45) Date of Patent: Jan. 19, 2021

(54) DYNAMICALLY CONTROLLING RANDOM ACCESS MEMORY RETENTION IN A WIRELESS DEVICE

(71) Applicant: Apple Inc., Cupertino, CA (US)

(72) Inventors: Li Su, San Jose, CA (US); Longda Xing, San Jose, CA (US)

(73) Assignee: Apple Inc., Cupertino, CA (US)

( * ) Notice: Subject to any disclaimer, the term of this patent is extended or adjusted under 35 U.S.C. 154(b) by 498 days.

(21) Appl. No.: 15/472,420

(22) Filed: Mar. 29, 2017

(65) Prior Publication Data

US 2017/0344296 A1 Nov. 30, 2017

Related U.S. Application Data

(60) Provisional application No. 62/342,792, filed on May 27, 2016.

(51) Int. Cl.
*G06F 13/00* (2006.01)
*G06F 1/3225* (2019.01)
*G06F 1/3234* (2019.01)
*G11C 11/4072* (2006.01)

(52) U.S. Cl.
CPC ............ *G06F 13/00* (2013.01); *G06F 1/3225* (2013.01); *G06F 1/3275* (2013.01); *G11C 11/4072* (2013.01)

(58) Field of Classification Search
USPC ................................. 711/100, 104, 154, 200
See application file for complete search history.

(56) References Cited

U.S. PATENT DOCUMENTS

| 9,165,641 | B2 | 10/2015 | Gulati et al. | |
| 9,280,389 | B1* | 3/2016 | Lipsio, Jr. ............. | G06F 9/4812 |
| 9,396,122 | B2 | 7/2016 | Biswas et al. | |
| 9,513,693 | B2 | 12/2016 | Jain et al. | |
| 2003/0188205 | A1* | 10/2003 | Mylly ..................... | G06F 1/266 713/300 |
| 2004/0098629 | A1* | 5/2004 | Khan ....................... | G06F 1/28 713/300 |
| 2004/0146030 | A1* | 7/2004 | Hsieh ................ | H04W 52/0248 370/336 |
| 2007/0091707 | A1* | 4/2007 | Hidaka ................. | G11C 11/005 365/230.03 |
| 2009/0049220 | A1* | 2/2009 | Conti ...................... | G06F 13/24 710/267 |
| 2011/0154078 | A1* | 6/2011 | Nrusimhan N.V. ... | G06F 1/3212 713/323 |

(Continued)

*Primary Examiner* — Tuan V Thai
(74) *Attorney, Agent, or Firm* — Kowert, Hood, Munyon, Rankin & Goetzel, P.C.

(57) ABSTRACT

A wireless communication device (UE) may include random access memory and associated software configured to selectively place different memory banks into either an active power on mode, retention mode, or power off mode. The selective placement of memory banks into different modes may be performed based on a variety of factors including software module voting information, a current power mode of the memory banks, one or more software program(s) and/or data currently stored on the memory banks, and a counter that counts an amount of time during which a memory bank is not accessed. The placement of memory banks into different modes may be controlled by a memory controller coupled to the memory banks.

20 Claims, 6 Drawing Sheets

(56) References Cited

U.S. PATENT DOCUMENTS

| | | | |
|---|---|---|---|
| 2012/0260056 A1* | 10/2012 | Hikichi | G06F 12/0862 |
| | | | 711/165 |
| 2013/0073886 A1* | 3/2013 | Zaarur | G06F 12/023 |
| | | | 713/320 |
| 2014/0059372 A1* | 2/2014 | Guntur | G06F 1/3234 |
| | | | 713/323 |
| 2015/0082062 A1* | 3/2015 | Saraswat | G06F 1/3275 |
| | | | 713/323 |
| 2015/0106671 A1* | 4/2015 | Guo | G11C 29/52 |
| | | | 714/721 |
| 2015/0146494 A1 | 5/2015 | Riho | |
| 2015/0370316 A1* | 12/2015 | Park | G06F 1/3234 |
| | | | 455/574 |
| 2016/0259398 A1* | 9/2016 | Newham | G06F 1/3275 |
| 2016/0320994 A1* | 11/2016 | Chun | G06F 3/0625 |

\* cited by examiner

DYNAMICALLY CONTROLLING RANDOM ACCESS MEMORY RETENTION IN A WIRELESS DEVICE

PRIORITY CLAIM

This application claims benefit of priority to Application No. 62/342,792 titled "Dynamically Controlling Random Access Memory Retention in a Wireless Device", filed on May 27, 2016, which is hereby incorporated by reference as though fully and completely set forth herein.

FIELD OF THE INVENTION

The present application relates to wireless communications, and more particularly to dynamically controlling random access memory retention during cellular operations for reduced power requirements.

DESCRIPTION OF THE RELATED ART

Wireless communication systems are rapidly growing in usage. In recent years, wireless devices such as smart phones and tablet computers have become increasingly sophisticated. In addition to supporting telephone calls, many mobile devices (i.e., user equipment devices or UEs) now provide access to the Internet, email, text messaging, and navigation using the global positioning system (GPS), and are capable of operating sophisticated applications that utilize these functionalities. Additionally, there exist numerous different wireless communication technologies and standards. Some examples of wireless communication standards include GSM, UMTS (WCDMA, TDS-CDMA), LTE, LTE Advanced (LTE-A), HSPA, 3GPP2 CDMA2000 (e.g., 1×RTT, 1×EV-DO, HRPD, eHRPD), IEEE 802.11 (WLAN or Wi-Fi), IEEE 802.16 (WiMAX), BLUETOOTH™, etc.

The ever-increasing number of features and functionality introduced in wireless communication devices also creates a continual need for improvement in both wireless communications and in wireless communication devices. However, increasing the functionality of a UE device can place a significant strain on the battery life of the UE device. Batteries hold a finite charge, and thus in order to improve battery life of wireless devices, it would be desirable to reduce the power requirements of the wireless device. Thus improvements in the field are desired.

SUMMARY OF THE INVENTION

Embodiments are presented herein of, inter alia, of methods for dynamically controlling random access memory retention during cellular operations for reduced power requirements. Embodiments are presented herein of wireless user equipment (UE) devices, such as cellular phones and/or accessory devices, such as wearable devices, which may communicate in a wireless communication system.

According to techniques described herein, a wireless device such as a user equipment device (UE), may comprise a radio comprising one or more antennas configured for wireless communication on a cellular network, a processing element operably coupled to the radio, and a random access memory (RAM) coupled to the processing element. The RAM may be configured to store one or more software programs used by the processing element in performing cellular communication functions, wherein the RAM comprises a plurality of memory banks.

In some embodiments, the UE is configured to maintain information for each respective memory bank of the plurality of the memory banks, the information comprising voting information indicating which of two or more software modules have indicated that the respective memory bank should be placed in a retention mode.

In some embodiments, the UE may be further configured to dynamically place one or more of the memory banks of the random access memory into retention mode based at least in part on the information, wherein the retention mode preserves data in the one or more memory banks and utilizes less power than other memory banks of the memory that are actively in use.

In some embodiments, the information maintained by the UE for each respective memory bank may further comprise information regarding a current power mode of the respective memory bank, one or more of the software program(s) and/or data currently stored in the respective memory bank, and at least one indication of whether the one or more software program(s) and/or data are being used in current cellular communication operations.

Each of the memory banks may be configured to be placed in a power mode comprising an active power on mode, the retention mode, and a power off mode. The active power mode may indicate that a respective memory bank is being actively used in cellular operations and may consume a first level of power. The retention mode may indicate that a respective memory bank is not being actively used in cellular operations and data is being retained in the memory, and the retention mode may consume a second level of power less than the first level. The power off mode may indicate that a respective memory bank is not being actively used in cellular operations, is powered off, and data is not being retained in the memory, and the power off mode may consume a third level of power less than the second level.

The UE may further comprise a plurality of memory controllers, wherein each of the memory controllers are coupled to one or more of the memory banks, wherein each memory controller is configured to control access to its respective one or more memory banks and selectively place its respective one or more memory banks in a power mode based on the information.

The UE may further comprise a plurality of counters, wherein each one of the counters is associated with a respective one of the memory banks, wherein each of the counters counts an amount of time during which its respective memory bank is not accessed. The UE may be configured to dynamically place portions of the random access memory into the retention mode based at least in part on values of the counters.

The information maintained by the UE for each respective memory bank may further comprise an owner bitmap which indicates which modules have code/data in the RAM bank, a retention vote bitmap which indicates which modules have indicated the RAM bank can be in retention mode, and a power off vote bitmap which indicates which modules have indicated the RAM bank can be in power off mode. When all owners have voted for the RAM bank to be in retention mode, the RAM bank may be put into power retention, and when all owners have voted for the RAM bank to be in power off mode, the RAM bank may be put into power off mode.

The techniques described herein may be implemented in and/or used with a number of different types of devices, including but not limited to cellular phones, tablet computers, wearable computing devices, portable media players, and any of various other computing devices.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

Figure 1:
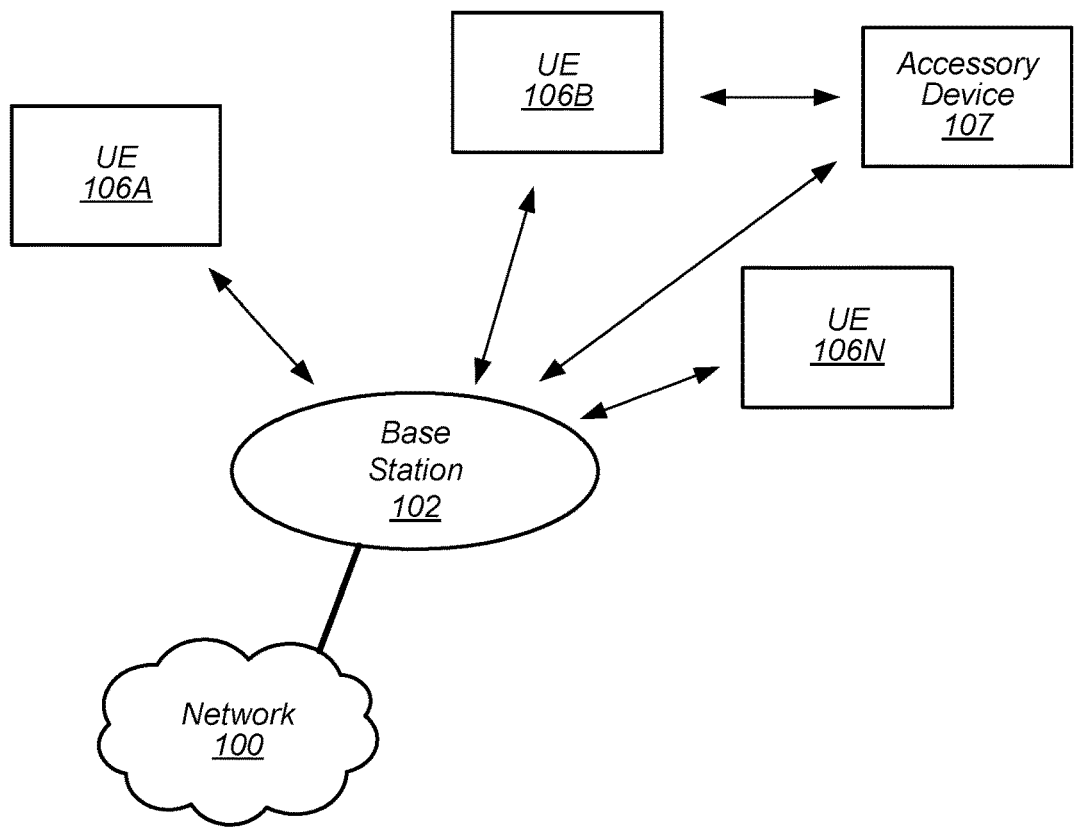
FIG. 1 illustrates an exemplary (and simplified) wireless communication system, according to some embodiments.

While features described herein are susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION OF THE EMBODIMENTS

Acronyms

Various acronyms are used throughout the present application. Definitions of the most prominently used acronyms that may appear throughout the present application are provided below:
BS: Base Station
UE: User Equipment
RF: Radio Frequency
DL: Downlink (from BS to UE)
UL: Uplink (from UE to BS)
FDD: Frequency Division Duplexing
TDD: Time Division Duplexing
LTE: Long Term Evolution
TX: Transmission/Transmit
RX: Reception/Receive
RAT: Radio Access Technology
MAC: Media Access Control (layer)
PDCP: Packet Data Convergence Protocol
TCP/IP: Transmission Control Protocol/Internet Protocol
RLC: Radio Link Control
AS: Access Stratum
NAS: Non-Access Stratum Terms The following is a glossary of terms that may appear in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer system for execution. The term "memory medium" may include two or more memory mediums which may reside in different locations, e.g., in different computer systems that are connected over a network.

Carrier Medium—a memory medium as described above, as well as a physical transmission medium, such as a bus, network, and/or other physical transmission medium that conveys signals such as electrical, electromagnetic, or digital signals.

Computer System (or Computer)—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" may be broadly defined to encompass any device (or combination of devices) having at least one processor that executes instructions from a memory medium.

User Equipment (UE) (or "UE Device")—any of various types of computer systems devices which are mobile or portable and which performs wireless communications. Also referred to as wireless communication devices. Examples of UE devices include mobile telephones or smart phones (e.g., iPhone™, Android™-based phones) and tablet computers such as iPad™, Samsung Galaxy™, etc., portable gaming devices (e.g., Nintendo DS™, PlayStation Portable™, Gameboy Advance™, iPod™), laptops, wearable devices (e.g. Apple Watch™, Google Glass™), PDAs, portable Internet devices, music players, data storage devices, or other handheld devices, etc. Various other types of devices would fall into this category if they include Wi-Fi or both cellular and Wi-Fi communication capabilities and/or other wireless communication capabilities, for example over short-range radio access technologies (SRATs) such as BLUETOOTH™, etc. In general, the term "UE" or "UE device" may be broadly defined to encompass any electronic, computing, and/or telecommunications device (or combination of devices) which is easily transported by a user and capable of wireless communication.

Base Station (BS)—The term "Base Station" has the full breadth of its ordinary meaning, and at least includes a wireless communication station installed at a fixed location and used to communicate as part of a wireless cellular communication system or radio system.

Processing Element—refers to various elements or combinations of elements that are capable of performing a function in a device, e.g. in a user equipment device or in a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Wireless Device (or wireless communication device)— any of various types of electronic devices, e.g. computer system devices, which perform wireless communications such as wireless local area network (WLAN) communications, cellular communications according to one or more of a number of different cellular radio access technologies, Wi-Fi communications, and the like. The wireless communication device may wirelessly communicate through one or more respective radio frequency (RF) interfaces that facilitate such communications. As used herein, the term "wireless device" may refer to a UE device, as defined above, or to a stationary device, such as a stationary wireless client or a wireless base station. For example a wireless device may be any type of wireless station of an IEEE 802.11 system, such as an access point (AP) or a client station, or any type of wireless station of a cellular communication system communicating according to one or more cellular radio access technologies (e.g. LTE, CDMA, GSM), such as a base station (or cellular tower) or a cellular telephone, for example. A wireless device may communicate according to multiple different radio access technologies, for example over multiple RF interfaces.

Wi-Fi—The term "Wi-Fi" has the full breadth of its ordinary meaning, and at least includes a wireless communication network or RAT that is serviced by wireless LAN (WLAN) access points and which provides connectivity through these access points to the Internet. Most modern Wi-Fi networks (or WLAN networks) are based on IEEE 802.11 standards and are marketed under the name "Wi-Fi". A Wi-Fi (WLAN) network is different from a cellular network.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Station (STA)—The term "station" herein refers to any device that has the capability of communicating wirelessly, e.g. by using the 802.11 protocol. A station may be a laptop, a desktop PC, PDA, access point or Wi-Fi phone or any type of device similar to a UE. An STA may be fixed, mobile, portable or wearable. Generally in wireless networking terminology, a station (STA) broadly encompasses any device with wireless communication capabilities, and the terms station (STA), wireless client (UE) and node (BS) are therefore often used interchangeably.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

Figure 2:
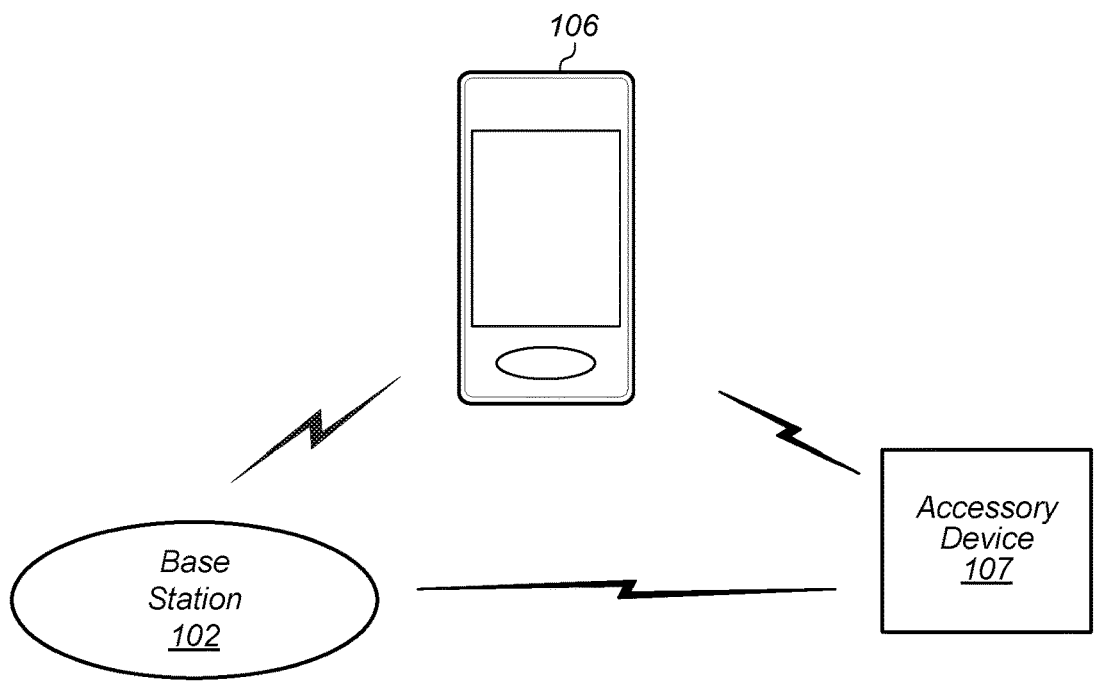
FIG. 2 illustrates an exemplary base station in communication with an exemplary wireless user equipment (UE) device and an exemplary accessory device, according to some embodiments.

FIGS. 1 and 2—Exemplary Communication System

FIG. 1 illustrates an exemplary (and simplified) wireless communication system, according to some embodiments. It is noted that the system of FIG. 1 is merely one example of a possible system, and embodiments may be implemented in any of various systems, as desired.

As shown, the exemplary wireless communication system includes a base station 102 which communicates over a transmission medium with one or more user devices 106-1 through 106-N and accessory device 107. Each of the user devices and the accessory device may be referred to herein as a "user equipment" (UE) or UE device. Thus, the user devices 106 are referred to as UEs or UE devices. For the purposes of this disclosure, accessory device 107 may also be considered a UE device.

The base station 102 may be a base transceiver station (BTS) or cell site, and may include hardware that enables wireless communication with the UEs 106A through 106N and with accessory device 107. Accessory device 107 may also communicate directly with a UE device, e.g. with UE device 106B. The base station 102 may also be equipped to communicate with a network 100 (e.g., a core network of a cellular service provider, a telecommunication network such as a public switched telephone network (PSTN), and/or the Internet, among various possibilities). Thus, the base station 102 may facilitate communication between the user devices and/or between the user devices and the network 100. The communication area (or coverage area) of the base station may be referred to as a "cell." As also used herein, from the perspective of UEs, a base station may sometimes be considered as representing the network insofar as uplink and downlink communications of the UE are concerned. Thus, a UE communicating with one or more base stations in the network may also be interpreted as the UE communicating with the network.

The base station 102 and the user devices may be configured to communicate over the transmission medium using any of various radio access technologies (RATs), also referred to as wireless communication technologies, or telecommunication standards, such as GSM, UMTS (WCDMA), LTE, LTE-Advanced (LTE-A), LAA/LTE-U, 3GPP2 CDMA2000 (e.g., 1×RTT, 1×EV-DO, HRPD, eHRPD), Wi-Fi, WiMAX etc.

UE 106/107 may be capable of communicating using multiple wireless communication standards. For example, a UE 106/107 might be configured to communicate using either or both of a 3GPP cellular communication standard (such as LTE) or a 3GPP2 cellular communication standard (such as a cellular communication standard in the CDMA2000 family of cellular communication standards). In some embodiments, the UE 106/107 may be configured to operate with reduced power consumption, at least according to the various methods as described herein. Base station 102 and other similar base stations operating according to the same or a different cellular communication standard may thus be provided as one or more networks of cells, which may provide continuous or nearly continuous overlapping service to UE 106/107 and similar devices over a wide geographic area via one or more cellular communication standards.

The UE 106/107 might also or alternatively be configured to communicate using WLAN, BLUETOOTH™, one or more global navigational satellite systems (GNSS, e.g., GPS or GLONASS), one and/or more mobile television broadcasting standards (e.g., ATSC-M/H or DVB-H), etc. Other combinations of wireless communication standards (including more than two wireless communication standards) are also possible.

FIG. 2 illustrates an exemplary user equipment 106 (e.g., one of the devices 106-1 through 106-N) and accessory device 107 in communication with the base station 102, according to some embodiments. Accessory device 107 may also communicate with UE device 106. The UE 106 may be a device with wireless network connectivity such as a mobile phone, a hand-held device, a computer or a tablet, or virtually any type of wireless device. Similarly, accessory device may be a device with wireless network connectivity such as headphones, smart watch, smart glasses, and the like. The UE 106 and/or accessory device 107 may perform any of the method embodiments described herein. The UE 106 and accessory device 107 may be configured to communicate using any of multiple wireless communication protocols. For example, the UE 106 may be configured to communicate using any one or more of CDMA2000, LTE, LTE-A, WLAN, or GNSS. Accessory device may be configured to communicate using any one or more of WLAN, BLUETOOTH™, Wi-Fi, and/or any cellular radio access technologies. Other combinations of wireless communication standards are also possible.

The UE 106 may include one or more antennas for communicating using one or more wireless communication protocols according to one or more RAT standards. In some embodiments, the UE 106 may share one or more parts of a receive chain and/or transmit chain between multiple wireless communication standards. The shared radio may include a single antenna, or may include multiple antennas (e.g., for MIMO) for performing wireless communications. Alternatively, the UE 106 may include separate transmit and/or receive chains (e.g., including separate antennas and other radio components) for each wireless communication protocol with which it is configured to communicate. As another alternative, the UE 106 may include one or more radios which are shared between multiple wireless communication protocols, and one or more radios which are used exclusively by a single wireless communication protocol. For example, the UE 106 may include a shared radio for communicating using either of LTE or CDMA2000 1×RTT, and separate radios for communicating using each of Wi-Fi and BLUETOOTH™. Other configurations are also possible.

Figure 3:
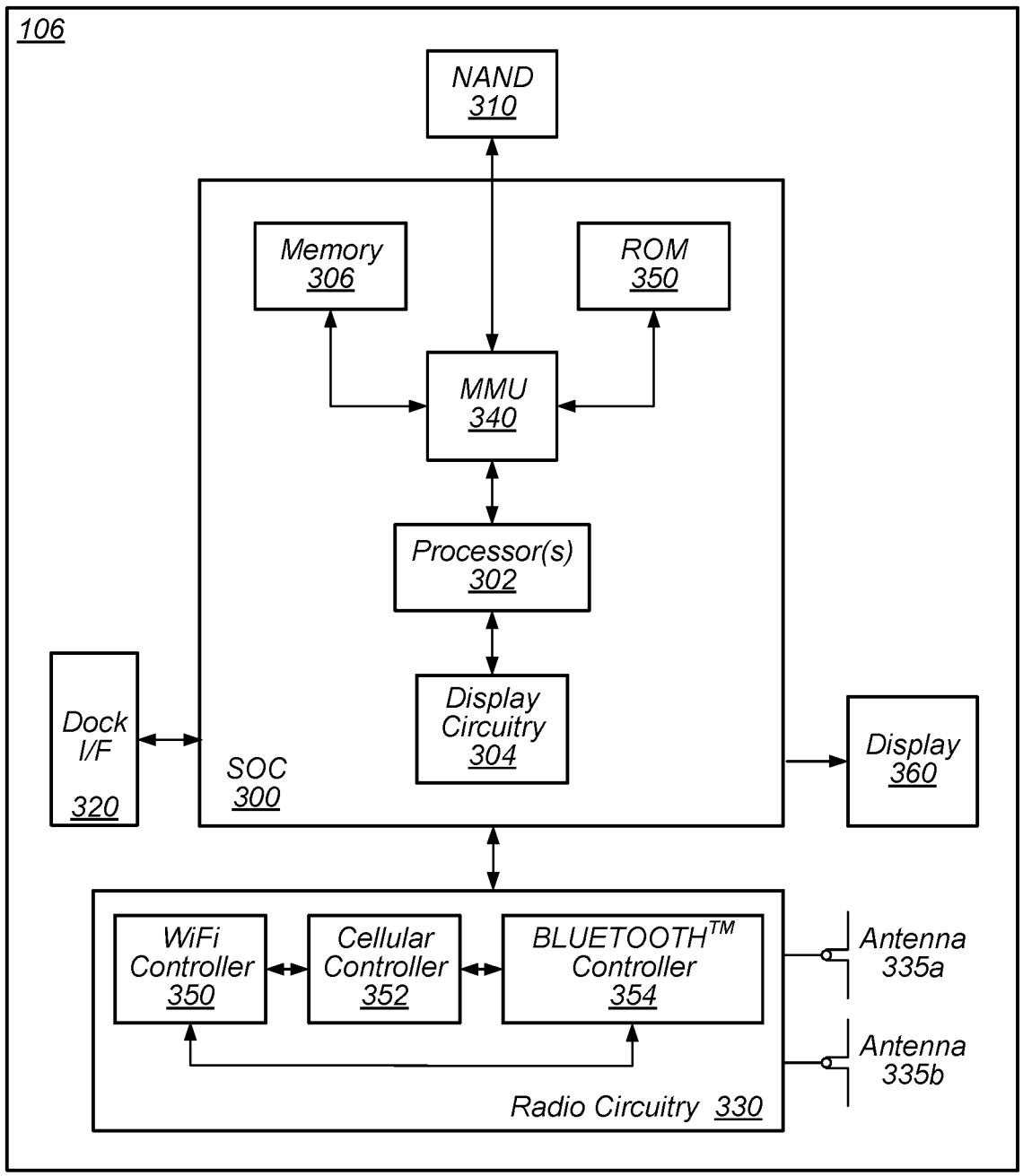
FIG. 3 illustrates an exemplary block diagram of a UE, according to some embodiments.

FIG. 3—Block Diagram of an Exemplary UE

FIG. 3 illustrates a block diagram of an exemplary UE 106, according to some embodiments. As shown, the UE 106 may include a system on chip (SOC) 300, which may include portions for various purposes. For example, as shown, the SOC 300 may include processor(s) 302 which may execute program instructions for the UE 106 and display circuitry 304 which may perform graphics processing and provide display signals to the display 360. The processor(s) 302 may also be coupled to memory management unit (MMU) 340, which may be configured to receive addresses from the processor(s) 302 and translate those addresses to locations in memory (e.g., memory 306, read only memory (ROM) 350, NAND flash memory 310) and/or to other circuits or devices, such as the display circuitry 304, radio 330, connector I/F 320, and/or display 360. The MMU 340 may be configured to perform memory protection and page table translation or set up. In some embodiments, the MMU 340 may be included as a portion of the processor(s) 302.

As shown, the SOC 300 may be coupled to various other circuits of the UE 106. For example, the UE 106 may include various types of memory (e.g., including Flash 310), a connector interface 320 (e.g., for coupling to the computer system), the display 360, and wireless communication circuitry (e.g., for LTE, LTE-A, CDMA2000, BLUETOOTH™, Wi Fi, GPS, etc.). The UE device 106 may include at least one antenna (e.g. 335a), and possibly multiple antennas (e.g. illustrated by antennas 335a and 335b), for performing wireless communication with base stations and/or other wireless communication devices. Antennas 335a and 335b are shown by way of example, and UE device 106 may include fewer or more antennas. Overall, the one or more antennas are collectively referred to as antenna 335. For example, the UE device 106 may use antenna 335 to perform the wireless communication with the aid of radio circuitry 330. As noted above, the UE may be configured to communicate wirelessly using multiple wireless communication standards in some embodiments.

As described further subsequently herein, the UE 106 (and/or base station 102) may include hardware and software components for implementing the operations described herein. The processor(s) 302 of the UE device 106 and various other components within UE 106 may implement part or all of the methods described herein. For example, processor(s) 302 may execute program instructions stored on a memory medium (e.g., a non-transitory computer-readable memory medium). In other embodiments, processor(s) 302 and/or at least certain portions of radio circuitry 330 may be configured as programmable hardware elements, such as FPGAs (Field Programmable Gate Arrays), or as ASICs (Application Specific Integrated Circuits) or as various dedicated circuits, or any number of combinations thereof.

Figure 4:
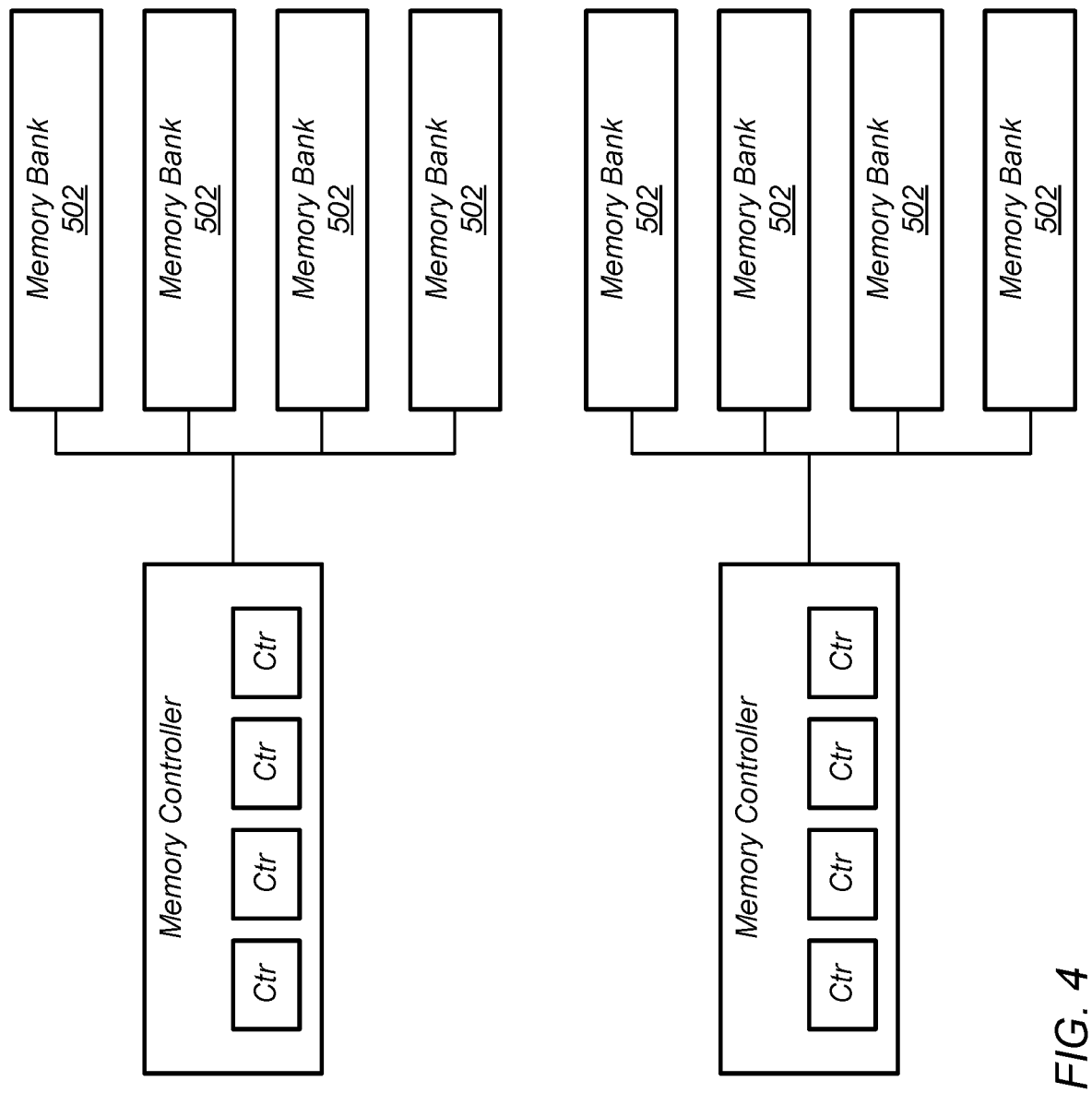
FIG. 4 illustrates a memory subsystem comprising memory controller each coupled to a plurality of memory banks.

FIG. 4—Memory Subsystem Block Diagram

FIG. 4 illustrates a block diagram of an example memory subsystem of the UE 106, according to some embodiments. As shown, the memory subsystem may include a random access memory comprising a plurality of memory banks. The memory subsystem may also comprise one or more memory controllers, where each memory controller may be configured to control one or more memory banks. In the example shown, each memory controller may couple to and control four memory banks. Each memory controller may be coupled to, or comprise, a plurality of counters, where each counter corresponds to a respective memory bank. Each counter may be configured to count a period of time during which its corresponding memory bank has not been accessed. This counter value may be used at least in part to help determine a power mode for the respective memory bank.

Random Access Memory Usage in Wireless Devices

The cellular baseband of a UE device supports 2G/3G/4G multi-mode operations, meaning that the cellular baseband is capable of supporting 2G, 3G or 4G communications. In order to support these different cellular standards, the cellular baseband may utilize a large random access memory (RAM) size for the 2G/3G/4G protocol stack and the radio frequency (RF) software (SW) and firmware (FW). For example, some widely used cellular baseband chips incorporate at least 128 Mbytes of internal RAM.

The internal RAM of a cellular baseband device is composed of multiple memory banks (e.g., as shown in FIG. 4), where each bank may be a certain size, (for example, smaller than 128 Mbytes, or smaller than 128 Kbytes, among other possibilities). Each memory bank may be capable of being individually powered in 3 modes: power off mode, retention mode, and power on active mode (or "active mode" for short). In power off mode, power is turned off to (or disconnected from) the RAM, and the data stored in the RAM is lost. In the power on active mode, power is being applied to the RAM and the RAM is in active operation, i.e., is actively being used by one or more devices, such as a processor. In the retention mode the RAM is not actively being used, but sufficient power is still applied to the RAM, on a sufficiently frequent basis, to ensure that the RAM's contents persist. The retention mode thus ensures that the data stored in the RAM is maintained, i.e., is not lost, and the RAM may be refreshed at a lower frequency than in active mode to reduce power requirements.

In the power on active mode, the memory bank may require a higher voltage such as 0.9V and higher power such as 325 uW per Megabyte (MB). In power off mode, the memory bank may require a lower voltage such as 0.6V and very low power such as 5 uW/MB. In retention mode, at 0.6V the memory bank may need 65 uW/MB, and at 0.9V the memory bank may need 148 uW/MB. The above values are merely examples. The transition time from retention mode to active mode may normally require 70 ns plus additional time for any needed voltage ramping, such as ramping from 0.6V to 0.9V.

Whenever a portion of RAM is not being accessed (such as by the baseband processor or CPU) for a period of time, the RAM may enter retention mode to save power, and the system may ensure that the data stored in the RAM is preserved. This would typically occur when the baseband processor is active, and becomes inactive from time to time. When the baseband processor is in deep sleep, in some embodiments all of the RAM may be placed in retention mode.

One class of devices comprises low power and/or low battery life devices, also referred to as "link budget limited" devices, such as wearable devices. For these types of devices which support cellular operations, saving power when the baseband is active may be more important than when the device is in deep sleep. This is evident from the following example data:

A) For a cellular capable wearable device, as one example the device may have a typical battery capacity of 925 mWh, and the internal RAM may be 14 Mbytes. In this example, when the baseband is active, it may consume 14 MB*325 uW/MB=4.55 mW. For a typical 12 hours of usage, this results in 4.55×12=54.6 mWh, which is about 6% of battery capacity.

B) If at any time, only 2 of the 14 Mbytes are actively powered on (in "active mode"), 12 Mbytes may be in retention mode with a lower voltage of 0.6V. In this case, when the baseband is active, it may consume 2*325+ 12*65=1.43 mW. For a typical 12 hours usage, this results in 1.43*12=17 mWh, which is about 1.8% of battery capacity.

C) If the 12 Mbytes are in retention mode with a higher voltage of 0.9V, then when the baseband is active it may consume 2*325+12*148=2.43 mW. For a typical 12 hours usage, this results in 2.43*12=29 mWh, which is about 3.15% of battery capacity.

D) Based on cellular protocol stack code analysis and use case scenario analysis, for a 2G/3G/4G multi-mode protocol stack, the total code/data size can be 128 Mbytes for a normal powered device, such as a smart phone. Code reduction, e.g., the elimination of unused features such as the 2G stack, may be performed to reduce the total code size down to 14 Mbytes. With a total code size of 14 Mbytes, at any time the actively used code/data may be around 2 Mbytes. For example, during a voice call the actively used code/data may be consumed by the L1 layer (Phy layer) software (about 250 Kbytes), the L2 (Layer 2) software (about 50 Kbytes), and a small portion of the radio resource control (RRC) software (about 20 Kbytes), for a total of about 320 Kbytes.

Thus, when the baseband is active, some embodiments operate to save battery power by only powering on the actively used RAM portion (placing the actively used RAM portion in active mode) and dynamically placing the currently unused RAM portion in retention mode. For example, for a 3G/4G cellular capable wearable device with 14 Mbytes of internal RAM and 925 mWh battery capacity, if at any time only the active 2 Mbytes are powered on (active mode), and the remaining 12 Mbytes are in retention mode, this will produce a savings of more than 4% of the total battery capacity per day.

In some embodiments, a UE device may be configured to dynamically place different inactive portions of the memory in retention mode based on current memory requirements and utilization. The UE device may be a normal powered device, such as a smart watch, or a low powered device, such as a wearable device.

Figure 5:
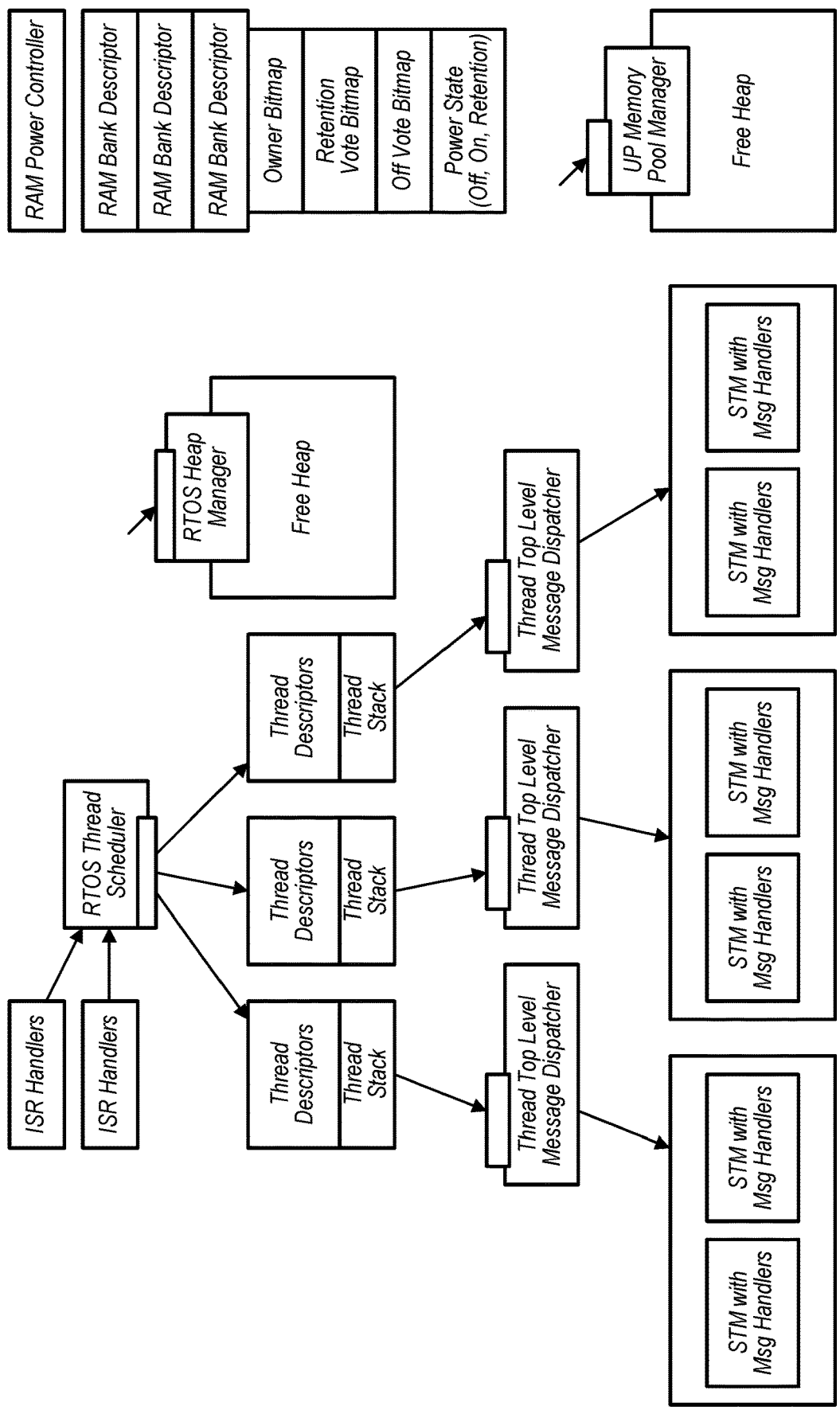
FIG. 5 illustrates software structures which may be placed in different power modes, according to some embodiments.

In some embodiments, the hardware design of the UE may be as follows. As shown in FIG. 5, the UE may comprise an internal RAM controller at the front end of each internal RAM block, so any access to each internal RAM block, such as CPU access or DMA access, goes through the RAM controller. Each internal RAM block may have multiple banks, where each bank can be individually controlled for 3 different power states or modes: power on (active) with higher voltage, power retention with lower voltage, power off with even lower voltage.

For each respective RAM bank, the RAM controller includes a corresponding counter that is associated with the respective RAM bank. For each RAM bank its associated counter counts the amount of time that the RAM bank has not been accessed. Whenever there is an access attempt to any RAM in the bank, the counter is reset to 0. If the bank is in retention mode and an access is received, the RAM controller suspends the access and then puts the bank out of retention and into power active mode. Also during this time, the RAM controller ramps the voltage from its current lower voltage to a higher voltage to be ready for the access. When the voltage has been ramped up to the proper amount and is ready, and the bank is in power active mode, the RAM controller resumes the access. This process results in an access delay for the very first access (the first time the bank is accessed), but any subsequent accesses will be as fast as an active RAM access.

When the counter for a particular bank reaches a predetermined threshold, such as clock cycle of about 50 ms, the RAM controller then determines that for approximately 50 ms the bank has not been accessed. In this case the RAM controller may put the bank into retention mode, and may also ramp down voltage from a high voltage (power active voltage) to a low voltage (retention voltage).

In some embodiments, the software design of the UE may be as follows. The baseband software normally has a real time operating system (RTOS) for scheduling multiple threads and interrupt service routines (ISRs), which implement or control protocol stacks and hardware drivers. The ISR handlers and RTOS thread scheduler are generally in the active power portion of the RAM, and these software components preferably only go into retention mode when the entire baseband processor has been placed into a deep sleep.

Real-time sensitive tasks are preferably always in active mode, the active power portion of the RAM, since they have high real-time requirements and thus high peak MIPS requirements. Examples of real-time sensitive tasks include radio frequency (RF) software and L1 (physical layer) management software for 2G/3G/4G. The extra delay to bring a portion of the RAM from retention mode back to active mode could reduce the peak CPU MIPS and hence cause real-time requirements for L1 to be missed.

Some hardware drivers such as for the UART (universal asynchronous receiver transmitter) and the PCIe (PCI express) bus are preferably always in power active RAM (active mode), as they control high speed I/O hardware and hence need fast response in processing HW input/output.

The 2G/3G/4G protocol software stacks may be organized based on layers and procedures defined by the 3GPP standard. Normally each layer is run by one or two threads. The main loop in a thread may be the top level message/event dispatcher, which dispatches received messages to multiple state machines which also have their own message handlers.

Multiples state machines with their message handlers can occupy several RAM banks, or share one RAM bank. The top level message dispatcher run by each thread can decide when to switch the power state of the RAM banks where each of the state machines reside.

After all of the RAM banks in which a thread's state machines resides are in retention mode, the thread can inform the RTOS scheduler, and the scheduler can then put the RAM thread itself and its associated stack into retention mode.

The RTOS manages a memory heap for message exchange between threads, and thus between layers and state machines of protocol stacks. Thus the heap manager controls the power state of RAM banks occupied by the RTOS heap. In some embodiments, all of the RAM banks in the free heap can be in the power off state.

The protocol stack has a data plane which transfers data packet data units (PDUs) among layers. A data plane memory pool may be used for allocating and freeing memory used by data PDU. The memory pool manager may control the power state of RAM banks occupied by the memory pool. In some embodiments, all of the RAM banks in the free memory pool can be in the power off state.

RAM Bank Descriptors

Figure 6:
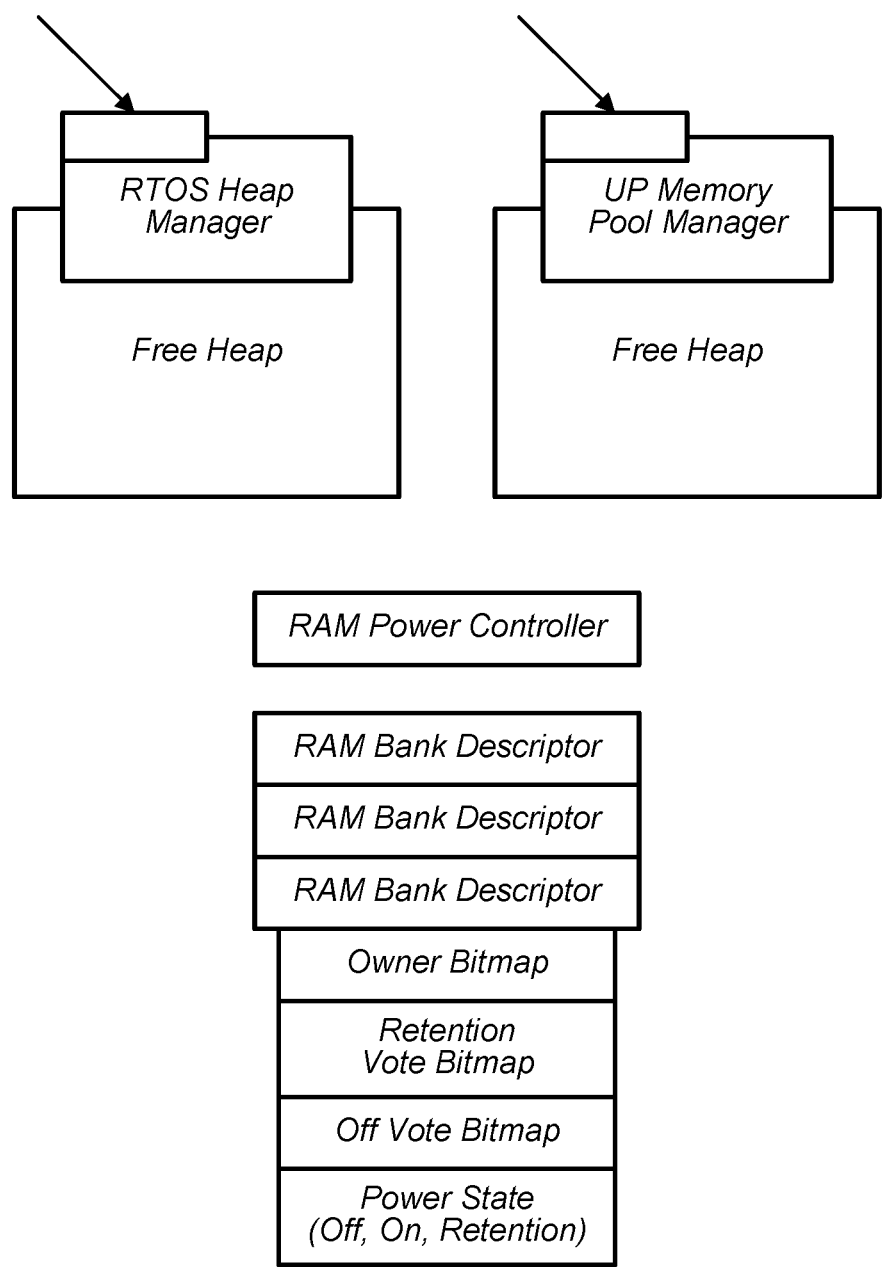
FIG. 6 illustrates software structures which may be placed in different power modes, according to some embodiments.

The software responsible for RAM power state control is called the RAM power controller. The RAM power controller software may maintain a list of data structures, referred to as RAM bank descriptors, for its RAM banks. Each RAM bank descriptor may be a data structure which includes its power mode or state (off, on, retention), its owner bitmap which indicates which SW modules have code/data in the RAM bank, its retention vote bitmap which indicates which modules currently stored in the RAM bank are voting for the RAM bank to be placed in retention, and its power off vote bitmap which indicates which modules currently stored in the RAM bank are voting for the RAM bank to be in the power off state. FIGS. 5 and 6 illustrate one embodiment of the RAM bank descriptors and their contents.

In some embodiments, only if all of the owners vote for the RAM bank to be placed in retention, the RAM bank is put into the power retention state. If less than all of the owners vote for the RAM bank to be placed in retention, the RAM bank is not put into the power retention state.

In some embodiments, only if all owners vote for the RAM bank to be placed in the power off state, the RAM bank is put into the power off state. If less than all of the owners vote for the RAM bank to be placed in the power off state, the RAM bank is not put into the power off state.

More detail on the RAM bank descriptors is provided below.

The UE includes cellular protocol stack software to communicate with the network. The protocol stack includes multiple layers such as the network access stratum (NAS) software layer, the access stratum (AS) software layer, and L1 software (physical layer software). The NAS further includes mobility network (MN) software, mobility management (MM) software, system management (SM) software, connection management (CM) software, and call control (CC) software. The AS further includes radio resource control (RRC) software, packet data convergence protocol (PDPCP), radio link control (RLC) and medias access control (MAC). These layers are also specific for a specific RAT, such as LTE, WCDMA. For example, the mobility management (MM) software includes MM software for LTE and MM software for WCDMA, etc.

In each layer for a specific RAT, the 3GPP standard specifies multiple procedures, and these procedures are classified into mainly 2 modes—idle mode and connected mode. Each mode has multiple procedures. For example, idle mode has a routing area update procedure, a location area update procedure, whereas connected mode has an RRC reconfiguration procedure, a handover procedure, etc.

Each of these procedures is implemented in the UE as software state machines with multiple message/event handlers, and thus they can be referred to as layer/procedure software modules. These SW modules are the owners of RAM banks. If one module occupies one RAM bank, then it is the only owner. If two modules occupy one RAM bank, then these two modules are the owners of the RAM bank, and the vote bitmap contains 2 bits, one bit for each owner.

In some embodiments, there are 2 criteria for a module to vote its RAM bank to be in retention mode:

1) The module is not involved in currently active procedure. For example, if the current mode is idle mode, then all procedures related to connected mode are not active. In other words, the modules related to connected mode procedures are not used, and thus these modules can vote yes for its RAM bank to go into retention mode.

2) Even if a module is related to the currently active procedure, if it has not been used for a period of time, for example, 30 ms. it can vote yes for its RAM bank to go into retention mode. This is because the time required for a RAM retention back to go to active power mode (to be turned on and active) is very short, for example 70 ns.

In some embodiments, there are 2 criteria for a module to vote its RAM bank in power off mode:

1) The module is not involved in a currently active procedure, and the conditions are not related to a currently active procedure. More specifically, the conditions of the procedures this module relates to are different from the conditions for a currently active procedure. For example, the module may be associated with, or belong to, a different mode, e.g., idle mode vs. connected mode. Even if the module belongs to the same mode, the radio condition (RSSI, RSRP/RSRQ for LTE, RSCP/EcNo for W) are dramatically different. For example, the radio link monitor procedure shows a very good radio or channel condition, which indicates that a handover procedure is very unlikely to happen. Thus modules related to handover procedure can vote its RAM bank to be power off.

2) the module has been in retention mode for a threshold period of time, for example, 1 minute.

In some embodiments, each individual thread top-level message dispatcher and RTOS scheduler decides if a RAM bank needs to be in the active power (power on) state. If the RAM bank is in the retention state, the RAM power controller may change the RAM bank power state to active power mode from retention mode by hardware configuration. If the RAM bank is in the power off state, the RAM power controller may change the RAM bank power state to active power from power off, and also reload the original code into the RAM bank.

2G/3G/4G protocol stack software may be organized per standard defined layers and procedures. For example, in the RRC layer state machines are organized by RRC procedures, so whenever a procedure is triggered by the network or the UE, RAM banks related to the active procedure are power on, and the other RAM banks may be placed in retention mode.

Figure 7:
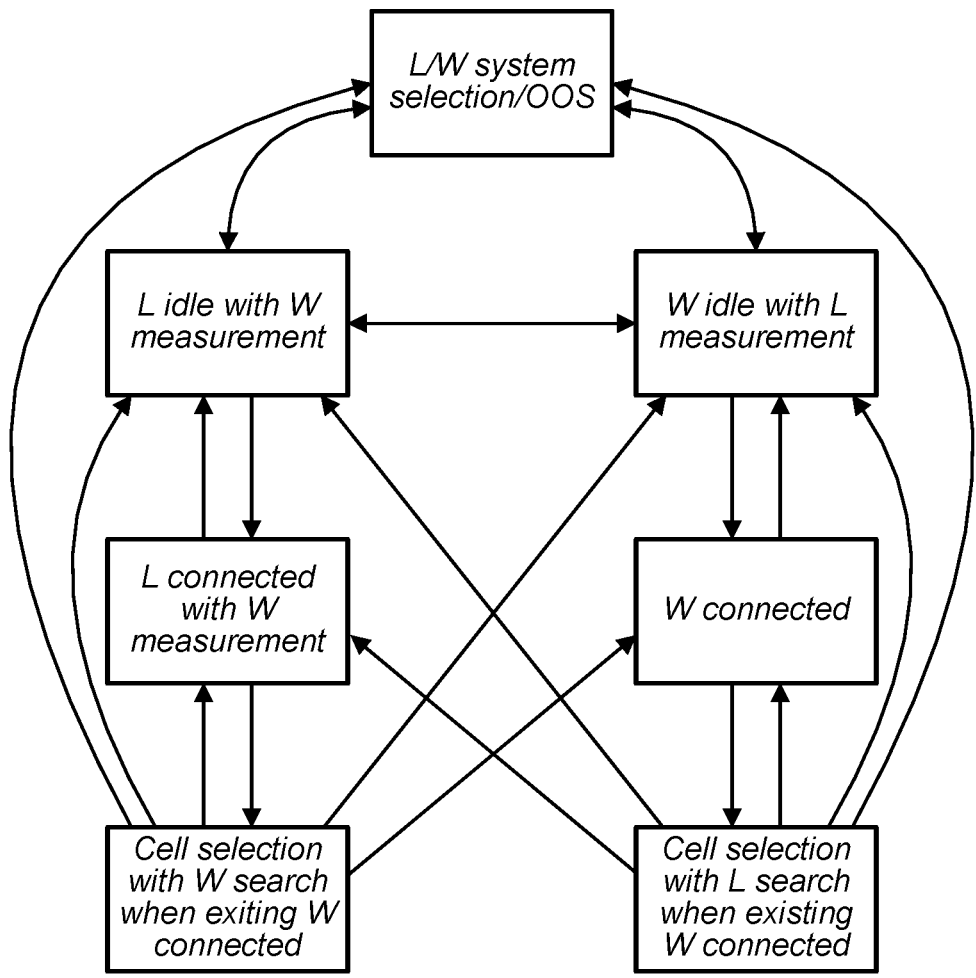
FIG. 7 illustrates LTE/WCDMA dual mode procedures.

FIGS. 5-7 provide greater detail on embodiments of the system described herein.

FIGS. 5 and 6 depict various software modules which may be used in the UE according to some embodiments. FIGS. 5 and 6 also illustrate information maintained by the UE to assist in determining a power mode for each of the memory banks, in particular, the RAM descriptors and their contents. as described above.

FIG. 7 illustrates transitions among two different radio access technologies (RATs), and more specifically illustrates dual mode procedures for LTE and WCDMA. As shown in FIG. 7, the LTE/WCDMA protocol stack may have the following top level procedures:

1. System selection/OOS
2. LTE idle with W-CDMA measurement
3. W-CDMA idle with LTE measurement
4. LTE connected with W-CDMA measurement
5. Cell selection with W-CDMA search when leaving LTE connected
6. W-CDMA connected
7. Cell selection with LTE search when leaving W-CDMA connected.

The following numbered paragraphs describe other potential embodiments of the invention.

In some embodiments, a wireless user equipment (UE) device may comprise a radio comprising one or more antennas configured for wireless communication on a cellular network, a processing element operably coupled to the radio, and a random access memory coupled to the processing element and configured to store various software programs used by the processing element in performing cellular communication functions, wherein the random access memory comprises a plurality of memory banks.

In these embodiments, the UE may be configured to maintain information for each respective memory bank of a plurality of the memory banks regarding a current power mode of the respective memory bank, one or more of the software program(s) and/or data currently stored in the respective memory bank, and at least one indication of whether the one or more software program(s) and/or data are being used in current cellular communication operations.

The UE may be further configured to dynamically place one or more of the memory banks of the random access memory into a retention mode based at least in part on the information, wherein the retention mode preserves data in the one or more memory banks and utilizes less power than other memory banks of the memory that are actively in use.

In some embodiments, the random access memory stores a plurality of software programs that are used in selecting a cellular radio access technology (RAT), wherein, during cellular RAT selection, the plurality of software programs that are used in selecting a cellular RAT are placed in an active power on mode.

In some embodiments, if the UE is not able to find a suitable cellular RAT on which to camp, a local memory unit in the random access memory is placed in a retention mode.

In some embodiments, when the UE is camped on a first radio access technology (RAT) and is measuring a second RAT, the UE is configured to place software modules related to paging, cell reselection, and radio resource control (RRC) connection establishment into an active power mode.

In some embodiments, when the UE is camped on a first radio access technology (RAT) and is measuring a second RAT, the UE is configured to place one or more memory banks into retention mode.

In some embodiments, when the UE is in idle mode on a first radio access technology (RAT) and is measuring a second RAT, the UE is configured to place memory banks which store a data plane buffer pool into a retention mode.

In some embodiments, when the UE is in idle mode camped on a preferred radio access technology (RAT), software modules relating to cell measurement are placed in retention mode until an out of service condition occurs.

In some embodiments, the random access memory stores first software programs configured to perform LTE communications and second software programs configured to perform WCDMA communications. In these embodiments, when the UE is camped on an LTE cell at least a subset of the WCDMA software programs are either in retention mode or power off mode, and when the UE is camped on a WCDMA cell at least a subset of the LTE software programs are either in retention mode or power off mode.

The invention claimed is:

1. A wireless user equipment device (UE), comprising:
a radio, comprising one or more antennas configured for wireless communication on a cellular network;
a processing element operably coupled to the radio;
a random access memory (RAM) coupled to the processing element and configured to store one or more software programs used by the processing element in performing cellular communication functions, wherein the RAM comprises a plurality of memory banks;
wherein the UE is configured to:
maintain information for each respective memory bank of the plurality of the memory banks, the information comprising voting information indicating which of two or more software modules have indicated that the respective memory bank should be placed in a retention mode;
dynamically place one or more of the memory banks of the random access memory(RAM) into the retention mode based at least in part on the information, wherein each of the one or more memory banks are placed into the retention mode based on all software modules associated with the voting information of the respective memory bank indicating that the respective memory bank be placed in the retention mode, wherein the retention mode preserves data in the one or more memory banks and utilizes less power than other memory banks of the memory that are actively in use; and
dynamically place at least one of the memory banks of the RAM into the retention mode based at least in part on an amount of time during which the at least one of the memory banks has not been accessed, wherein the amount of time during which the at least one of the memory banks has not been accessed is determined based on values of one or more counters.

2. The UE of claim 1, wherein the information maintained by the UE for each respective memory bank further comprises information regarding a current power mode of the respective memory bank, one or more of the software program(s) and/or data currently stored in the respective memory bank, and at least one indication of whether the one or more software program(s) and/or data are being used in current cellular communication operations.

3. The UE of claim 1, wherein each of the memory banks is configured to be placed in one of three power modes comprising an active power on mode, the retention mode, and a power off mode; wherein the active power mode indicates that a respective memory bank is being actively used in cellular operations and consumes a first level of power; wherein the retention mode indicates that a respective memory bank is not being actively used in cellular operations and data is being retained in the memory, and consumes a second level of power less than the first level; and wherein the power off mode indicates that a respective memory bank is not being actively used in cellular operations, is powered off, and data is not being retained in the memory, and consumes a third level of power less than the second level.

4. The UE of claim 3, wherein the UE further comprises a plurality of memory controllers, each of the memory controllers coupled to one or more of the memory banks, wherein each memory controller is configured to control access to its respective one or more memory banks and selectively place its respective one or more memory banks in one of the three power modes based on the information.

5. The UE of claim 4, wherein in response to a respective memory bank which is currently in retention mode receiving an access, the memory controller of the respective memory bank is configured to move the respective memory bank from the retention mode to the active power mode and ramp up a voltage to the respective memory bank from the second level to the first level.

6. The UE of claim 1, wherein the UE further comprises a plurality of counters including the one or more counters, each one of the plurality of counters associated with a respective one of the memory banks, wherein each of the plurality of counters counts an amount of time during which its respective memory bank is not accessed; wherein the UE is configured to dynamically place portions of the random access memory into the retention mode based at least in part on values of the counters.

7. The UE of claim 3, wherein the information maintained by the UE for each respective memory bank further comprises: an owner bitmap which indicates which modules have code/data in the RAM bank; a retention vote bitmap which indicates which modules have indicated the RAM bank can be in the retention mode, wherein when all owners have voted for the RAM bank to be in the retention mode, the RAM bank is put into the retention mode; and a power off vote bitmap which indicates which modules have indicated the RAM bank can be in the power off mode, wherein when all owners have voted for the RAM bank to be in the power off mode, the RAM bank is put into the power off mode.

8. The UE of claim 3, wherein memory banks which store code and/or data associated with real time critical tasks are placed in active power mode unless the entire random access memory is in sleep mode.

9. The UE of claim 3, wherein the random access memory stores a real time operating system (RTOS) and a plurality of interrupt service routines (ISRs) which implement or control communications protocol stacks and hardware drivers; wherein memory banks which store the RTOS and the ISRs are placed in active power mode unless the entire random access memory is in a sleep mode; wherein memory banks which store the RTOS and the ISRs are placed in retention mode when the entire random access memory is in sleep mode.

10. The UE of claim 3, wherein the UE includes a heap manager which controls a free memory pool; wherein memory banks in the free memory pool are in the power off mode.

11. A method for operating a wireless user equipment device (UE), the method comprising: maintaining information for each respective memory bank of a plurality of memory banks, wherein the plurality of memory banks are comprised within a random access memory (RAM) comprised within the UE, the information comprising voting information indicating which of two or more software modules of the UE have indicated that the respective memory bank should be placed in a retention mode;
dynamically placing one or more of the memory banks of the RAM into the retention mode based at least in part on the information, wherein each of the one or more memory banks are placed into the retention mode based on all software modules associated with the voting information of the respective memory bank indicating that the respective memory bank be placed in the retention mode, wherein the retention mode preserves data in the one or more memory banks and utilizes less power than other memory banks of the memory that are actively in use; and dynamically placing at least one of the memory banks of the RAM into the retention mode based at least in part on an amount of time during which the at least one of the memory banks has not been accessed, wherein the amount of time during which the at least one of the memory banks has not been accessed is determined based on values of one or more counters.

12. The method of claim 11, wherein the information maintained for each respective memory bank further comprises information regarding a current power mode of the respective memory bank, one or more software program(s) and/or data currently stored in the respective memory bank, and at least one indication of whether the one or more software program(s) and/or data are being used in current cellular communication operations.

13. The method of claim 11,
wherein each of the memory banks is configured to be placed in one of three power modes comprising an active power on mode, the retention mode, and a power off mode; wherein the active power mode indicates that a respective memory bank is being actively used in cellular operations and consumes a first level of power; wherein the retention mode indicates that a respective memory bank is not being actively used in cellular operations and data is being retained in the memory, and consumes a second level of power less than the first level; and wherein the power off mode indicates that a respective memory bank is not being actively used in cellular operations, is powered off, and data is not being retained in the memory, and consumes a third level of power less than the second level.

14. The method of claim 13, the method further comprising: operating a plurality of memory controllers comprised within the UE, wherein each of the memory controllers are coupled to one or more of the memory banks, wherein operating a memory controller comprises controlling access to its respective one or more memory banks and selectively placing its respective one or more memory banks in one of the three power modes based on the information.

15. The method of claim 13,
wherein the information maintained for each respective memory bank further comprises: an owner bitmap which indicates which modules have code/data in the RAM bank; a retention vote bitmap which indicates which modules have indicated the RAM bank can be in the retention mode, wherein when all owners have voted for the RAM bank to be in the retention mode, the RAM bank is put into the retention mode; and a power off vote bitmap which indicates which modules have indicated the RAM bank can be in the power off mode, wherein when all owners have voted for the RAM bank to be in the power off mode, the RAM bank is put into the power off mode.

16. A non-volatile computer-readable medium that stores instructions that, when executed by a wireless user equipment device (UE), cause the UE to:
maintain information for each respective memory bank of a plurality of memory banks, wherein the plurality of memory banks are comprised within a random access memory (RAM) comprised within the UE, the information comprising voting information indicating which of two or more software modules of the UE have indicated that the respective memory bank should be placed in a retention mode;
dynamically place one or more of the memory banks of the RAM into the retention mode based at least in part on the information, wherein each of the one or more memory banks are placed into the retention mode based on all software modules associated with the voting information of the respective memory bank indicating that the respective memory bank be placed in the retention mode, wherein the retention mode preserves data in the one or more memory banks and utilizes less power than other memory banks of the memory that are actively in use; and dynamically place at least one of the memory banks of the RAM into the retention mode based at least in part on an amount of time during which the at least one of the memory banks has not been accessed, wherein the amount of time during which the at least one of the memory banks has not been accessed is determined based on values of one or more counters.

17. The computer-readable medium of claim 16, wherein the information maintained for each respective memory bank further comprises information regarding a current power mode of the respective memory bank, one or more software program(s) and/or data currently stored in the respective memory bank, and at least one indication of whether the one or more software program(s) and/or data are being used in current cellular communication operations.

18. The computer-readable medium of claim 16, wherein the instructions are further executable to cause the UE to: place each of the memory banks in one of three power modes comprising an active power on mode, the retention mode, and a power off mode; wherein the active power mode indicates that a respective memory bank is being actively used in cellular operations and consumes a first level of power; wherein the retention mode indicates that a respective memory bank is not being actively used in cellular operations and data is being retained in the memory, and consumes a second level of power less than the first level; and wherein the power off mode indicates that a respective memory bank is not being actively used in cellular operations, is powered off, and data is not being retained in the memory, and consumes a third level of power less than the second level.

19. The computer-readable medium of claim 18, wherein the instructions are further executable to cause the UE to: operate a plurality of memory controllers comprised within the UE, wherein each of the memory controllers are coupled to one or more of the memory banks, wherein operating a memory controller comprises controlling access to its respective one or more memory banks and selectively placing its respective one or more memory banks in one of the three power modes based on the information.

20. The computer-readable medium of claim 18, wherein the information maintained for each respective memory bank further comprises:
an owner bitmap which indicates which modules have code/data in the RAM bank;
a retention vote bitmap which indicates which modules have indicated the RAM bank can be in the retention mode, wherein when all owners have voted for the RAM bank to be in the retention mode, the RAM bank is put into the retention mode; and a power off vote bitmap which indicates which modules have indicated the RAM bank can be in the power off mode, wherein when all owners have voted for the RAM bank to be in the power off mode, the RAM bank is put into the power off mode.

* * * * *